United States Patent
Jang et al.

[11] Patent Number: 6,004,873
[45] Date of Patent: *Dec. 21, 1999

[54] METHOD FOR REDUCING THE PATTERN SENSITIVITY OF OZONE ASSISTED CHEMICAL VAPOR DEPOSITED (CVD) SILICON OXIDE INSULATOR LAYERS

[75] Inventors: Syun-Ming Jang; Lu-Min Liu, both of Hsin-Chu, Taiwan

[73] Assignee: Taiwan Semiconductor Manufacturing Company, Ltd., Hsin-Chu, Taiwan

[*] Notice: This patent is subject to a terminal disclaimer.

[21] Appl. No.: 08/666,160

[22] Filed: Jun. 19, 1996

[51] Int. Cl.$^6$ .................................................. H01L 21/4763
[52] U.S. Cl. ............................ 438/618; 438/787; 438/798
[58] Field of Search ...................................... 438/618, 787, 438/798

[56] References Cited

U.S. PATENT DOCUMENTS 5,342,808   8/1994   Brigham et al. ........................ 437/228
5,674,783  10/1997   Jang et al. ............................... 438/697

*Primary Examiner*—John F. Niebling
*Assistant Examiner*—John Murphy
*Attorney, Agent, or Firm*—George O. Saile; Stephen B. Ackerman; Alek P. Szecsy

[57] ABSTRACT

A method for forming upon a patterned layer within an integrated circuit an ozone assisted Chemical Vapor Deposited (CVD) silicon oxide insulator layer having a diminished pattern sensitivity. There is first provided a semiconductor substrate. Formed upon the semiconductor substrate is a patterned layer which provides a pattern sensitivity to an ozone assisted Chemical Vapor Deposited (CVD) silicon oxide insulator layer formed upon the patterned layer. The patterned layer is also susceptible to modification with a plasma which reduces the pattern sensitivity of the ozone assisted Chemical Vapor Deposited (CVD) silicon oxide insulator layer formed upon the patterned layer. The patterned layer is treated with the plasma. Finally, the ozone assisted Chemical Vapor Deposited (CVD) silicon oxide insulator layer is formed upon the patterned layer. Optionally, a conformal insulator layer may be formed upon the patterned layer prior to forming the ozone assisted Chemical Vapor Deposited (CVD) silicon oxide insulator layer upon the patterned layer. The conformal insulator layer may optionally be treated with a second plasma.

26 Claims, 7 Drawing Sheets

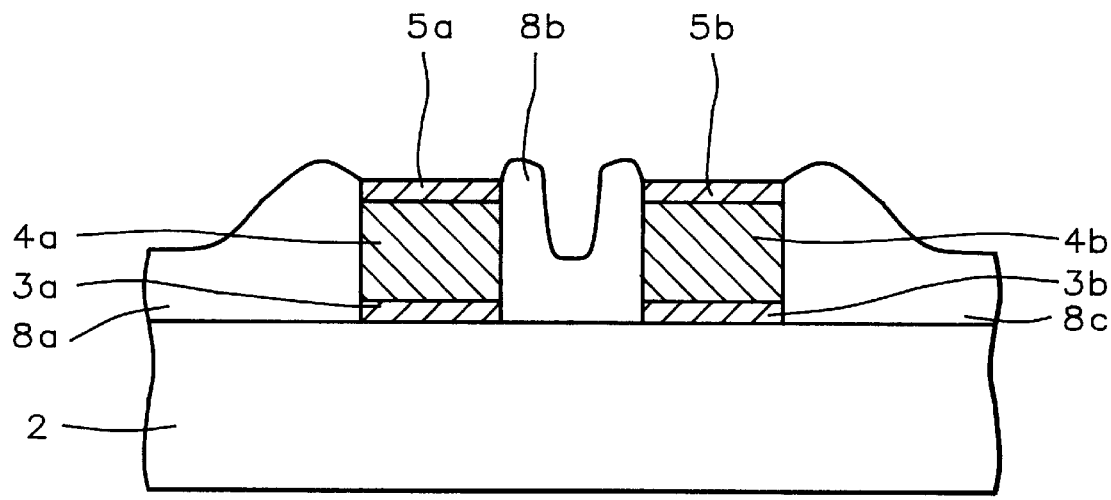
*FIG. 1 - Prior Art*
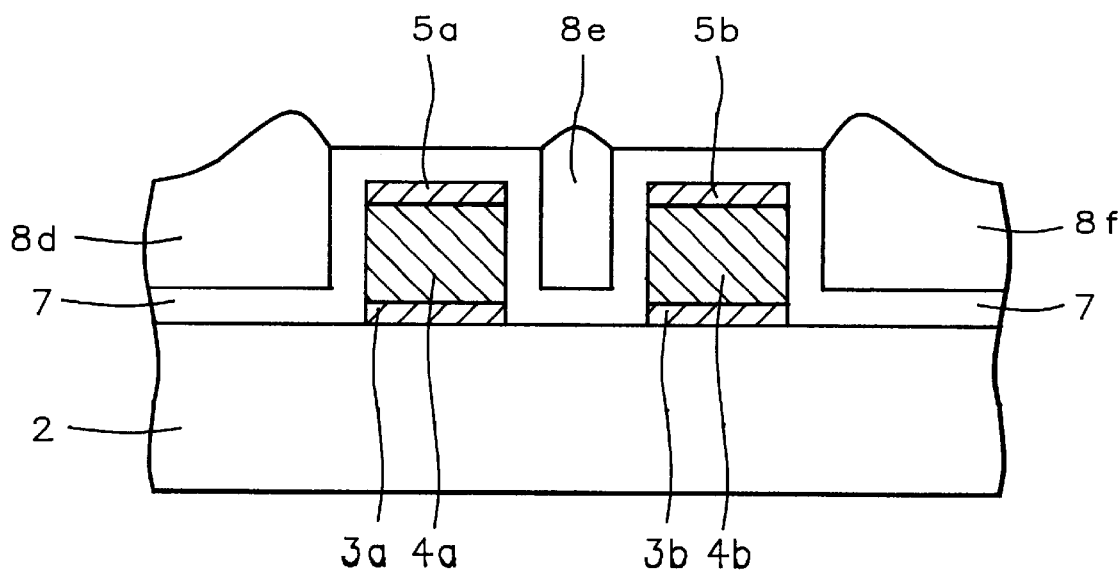
*FIG. 2 - Prior Art*

6,004,873

METHOD FOR REDUCING THE PATTERN SENSITIVITY OF OZONE ASSISTED CHEMICAL VAPOR DEPOSITED (CVD) SILICON OXIDE INSULATOR LAYERS

BACKGROUND OF THE INVENTION

1. Field of the Invention

The present invention relates generally to insulator layers within integrated circuits. More particularly, the present invention relates to methods for reducing the pattern sensitivity of ozone assisted Chemical Vapor Deposited (CVD) silicon oxide insulator layers within integrated circuits.

2. Description of the Related Art

As part of the evolutionary trend in semiconductor integrated circuit technology, there has been a continuing decrease in integrated circuit device and conductor element dimensions and a corresponding increase in aspect ratios of conductor elements which interconnect integrated circuit devices. Due to these decreases in conductor element dimensions and increases in conductor element aspect ratios, there is a continuing need for methods and materials through which there may be formed within integrated circuits insulator layers which possess excellent gap filling capabilities.

Recently developed within the art of insulator layers which possess excellent gap filling capabilities are silicon oxide insulator layers deposited upon patterned layers within integrated circuits through an ozone assisted Chemical Vapor Deposition (CVD) method. Silicon oxide insulator layers deposited through ozone assisted Chemical Vapor Deposition (CVD) methods are particularly efficient in forming void free gap filling silicon oxide insulator layers between dense high aspect ratio patterned conductor layers within integrated circuits.

Although silicon oxide insulator layers formed through ozone assisted Chemical Vapor Deposition (CVD) methods, in general, possess superb gap filling characteristics, such silicon oxide insulator layers are not without significant drawbacks. In particular, it is known in the art that ozone assisted Chemical Vapor Deposited (CVD) silicon oxide insulator layers typically exhibit a pattern sensitivity dependent upon the materials from which are formed the patterned substrate layers upon which are deposited the ozone assisted Chemical Vapor Deposited (CVD) silicon oxide insulator layers. The pattern sensitivity results from different deposition rates and/or different incubation times for forming ozone assisted Chemical Vapor Deposited silicon oxide insulator layers upon those different substrate layers.

Schematic cross-sectional diagrams of patterned integrated circuit layers which illustrate the results of the pattern sensitivity when forming upon the surfaces of those patterned integrated circuit layers an ozone assisted Chemical Vapor Deposited (CVD) silicon oxide insulator layer are shown in FIG. 1 and FIG. 2. Shown in FIG. 1 is a substrate layer 2 which is typically an insulator substrate layer formed of silicon oxide. Formed upon the substrate layer 2 is a pair of patterned stacks, typically patterned conductor stacks, which consist of patterned conductor layers 4a and 4b, beneath which reside patterned lower barrier layers 3a and 3b, respectively, and above which reside patterned upper barrier layers 5a and 5b, respectively. The patterned conductor layers 4a and 4b are typically formed of an aluminum containing alloy conductor and the patterned barrier layers 3a, 3b, 5a and 5b are typically formed of titanium nitride.

As shown in FIG. 1, a set of ozone assisted Chemical Vapor Deposited (CVD) silicon oxide insulator layers 8a, 8b and 8c, when formed within certain deposition conditions and parameters upon exposed portions of the substrate layer 2 and the patterned stacks, will exhibit decreasing deposition rates and increasing incubation times progressing from the substrate layer 2 to the patterned conductor layers 4a and 4b, and finally to the patterned upper barrier layers 5a and 5b. As also shown in FIG. 1, the ozone assisted Chemical Vapor Deposited (CVD) silicon oxide insulator layers 8a, 8b and 8c will not form upon the surfaces of the patterned upper barrier layers 5a and 5b until the incubation time for forming an ozone assisted Chemical Vapor Deposited (CVD) silicon oxide insulator layer upon the patterned upper barrier layers 5a and 5b layers has expired. Thus, resulting from the deposition rate differences and incubation time differences is a pattern sensitivity which is manifested as cusps where the ozone assisted Chemical Vapor Deposited (CVD) silicon oxide insulator layers 8a, 8b and 8c rise above but not upon the patterned upper barrier layers 5a and 5b.

Shown in FIG. 2 is a cross-sectional schematic diagram of an integrated circuit analogous to the cross-sectional diagram of the integrated circuit illustrated in FIG. 1, with the exception that a blanket conformal silicon oxide insulator layer 7 has been formed upon the exposed surfaces of the substrate layer 2 and the patterned stacks prior to forming the ozone assisted Chemical Vapor Deposited (CVD) silicon oxide insulator layers 8d, 8e and 8f thereupon. Notwithstanding the presence of the conformal silicon oxide insulator layer 7, a pattern sensitivity, although typically reduced, is still nonetheless observed when forming the ozone assisted Chemical Vapor Deposited (CVD) silicon oxide insulator layers 8d, 8e and 8f upon the conformal silicon oxide insulator layer 7. Analogously with the integrated circuit whose structure is illustrated in FIG. 1, the pattern sensitivity corresponds with the materials from which are formed the substrate layer 2 and the patterned stacks.

As a related phenomenon to the materials considerations through which pattern sensitivities within ozone assisted Chemical Vapor Deposited (CVD) silicon oxide insulator layers upon patterned layers within integrated circuits are derived, there also exists a patterned layer areal density phenomenon which simultaneously influences those pattern sensitivities. In particular it has been observed with respect to patterned layers formed of titanium nitride within integrated circuits that areal densities of the titanium nitride patterned layers in excess of about 50 percent provide patterned layers upon which are formed ozone assisted Chemical Vapor Deposited (CVD) silicon oxide insulator layers with substantially greater pattern sensitivities (ie: lower deposition rates and longer incubation times) than patterned titanium nitride layers of areal density less than about 40 percent.

Although the pattern sensitivities in forming ozone assisted Chemical Vapor Deposited (CVD) silicon oxide insulator layers upon patterned integrated circuit layers, such as patterned conductor layers, provide characteristics upon which several novel ozone assisted Chemical Vapor Deposited (CVD) silicon oxide insulator layer deposition processes may be based, the pattern sensitivities are often detrimental with regard to other ozone assisted Chemical Vapor Deposited (CVD) silicon oxide insulator layer deposition processes. In particular, the pattern sensitivities are detrimental when it is desired to form upon patterned layers within integrated circuits ozone assisted Chemical Vapor Deposited (CVD) silicon oxide insulator layers which possess uniformity across the patterned layer.

Thus, it is desirable in the art to provide methods for limiting the pattern sensitivity of ozone assisted Chemical Vapor Deposited (CVD) silicon oxide insulator layers upon patterned layers within integrated circuits. Particularly desirable in the art are methods through which pattern sensitivities derived from high areal density patterned layers may be limited. It is towards these goals that the present invention is directed.

SUMMARY OF THE INVENTION

A first object of the present invention is to provide a method for reducing the pattern sensitivity of ozone assisted Chemical Vapor Deposited (CVD) silicon oxide insulator layers formed upon patterned layers within integrated circuits.

A second object of the present invention is to provide a method in accord with the first object of the present invention, which method may be applied to high areal density patterned layers upon which are formed ozone assisted Chemical Vapor Deposited (CVD) silicon oxide insulator layers within integrated circuits.

A third object of the present invention is to provide a method in accord with the first object of the present invention and the second object of the present invention, which method is also manufacturable.

In accord with the objects of the present invention, there is provided a method for reducing the pattern sensitivity of ozone assisted Chemical Vapor Deposited (CVD) silicon oxide insulator layers formed upon patterned layers within integrated circuits. To practice the method of the present invention, there is first provided a semiconductor substrate having a patterned layer formed thereupon. The patterned layer provides a pattern sensitivity when forming an ozone assisted Chemical Vapor Deposited (CVD) silicon oxide insulator layer upon the patterned layer. The patterned layer is also susceptible to modification with a plasma which reduces the pattern sensitivity of the ozone assisted Chemical Vapor Deposited (CVD) silicon oxide insulator layer when formed upon the patterned layer. The patterned layer is treated with the plasma, and the ozone assisted Chemical Vapor Deposited (CVD) silicon oxide insulator layer is then formed upon the patterned layer.

The method of the present invention reduces the pattern sensitivity of ozone assisted Chemical Vapor Deposited (CVD) silicon oxide insulator layers formed upon patterned layers within integrated circuits. While the mechanism through which the plasma treatment of the method of the present invention modifies patterned layers within integrated circuits is not entirely understood, it is nonetheless clear that patterned layers which provide a pattern sensitivity when ozone assisted Chemical Vapor Deposited (CVD) silicon oxide insulator layers are formed upon those patterned layers will provide a reduction in pattern sensitivity when those patterned layers are treated with a plasma in accord with the method of the present invention.

The method of the present invention is readily manufacturable and applicable to high areal density patterned layers upon which may be formed ozone assisted Chemical Vapor Deposited (CVD) silicon oxide insulator layers within integrated circuits. Methods through which plasmas may be formed for use in modifying layers within integrated circuits are known in the art of integrated circuit manufacture. Such methods are readily manufacturable and readily applicable to high areal density patterned layers within integrated circuits.

BRIEF DESCRIPTION OF THE DRAWINGS

The accompanying drawings, which form a material part of this disclosure, show the following:

FIG. 1 and FIG. 2 show a pair of schematic cross-sectional diagrams illustrating the results of a pattern sensitivity of the prior art when forming ozone assisted Chemical Vapor Deposited (CVD) silicon oxide insulator layers upon patterned layers within an integrated circuit.

DESCRIPTION OF THE PREFERRED EMBODIMENTS

The present invention provides a method for minimizing the pattern sensitivity of ozone assisted Chemical Vapor Deposited (CVD) silicon oxide insulator layers formed upon patterned layers within integrated circuits. The pattern sensitivity of ozone assisted Chemical Vapor Deposited (CVD) silicon oxide insulator layers upon patterned layers within integrated circuits has been disclosed in the art. See, for example, S. M. Jang et al., "Method for Selectively Depositing Silicon Oxide Insulator Layers," U.S. patent application Ser. No. 08/518,706, filed Aug. 24, 1995, now U.S. Pat. No. 5,518,959, issued May 21, 1996, the teachings of which are incorporated herein by reference.

The method of the present invention minimizes the pattern sensitivity of those ozone assisted Chemical Vapor Deposited (CVD) silicon oxide insulator layers by treating the patterned layers upon which are formed those ozone assisted Chemical Vapor Deposited (CVD) silicon oxide insulator layers with a plasma. Although the mechanism by which the plasma treatment of the patterned layers provides patterned layers upon which may be formed ozone assisted Chemical Vapor Deposited (CVD) silicon oxide insulator layers with diminished pattern sensitivity is not well understood, it is nonetheless clear that treating the patterned layers with a plasma in accord with the method of the present invention provides patterned layers upon which there may be formed ozone assisted Chemical Vapor Deposited (CVD) silicon oxide insulator layers with diminished pattern sensitivity.

The method of the present invention may be employed in forming ozone assisted Chemical Vapor Deposited (CVD) silicon oxide insulator layers having diminished pattern sensitivity within various types of integrated circuits. The method of the present invention may be employed in forming ozone assisted Chemical Vapor Deposited (CVD) silicon oxide insulator layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Metal Oxide Semiconductor Field Effect Transistors (MOSFETs), integrated circuits having within their fabrications bipolar transistors and integrated circuits having within their fabrications Bipolar Complementary Metal Oxide Semiconductor (BiCMOS) transistors. The method of the present invention has broad applicability in forming within integrated circuits ozone assisted Chemical Vapor Deposited (CVD) silicon oxide insulator layers with diminished pattern sensitivity.

Figure 3:
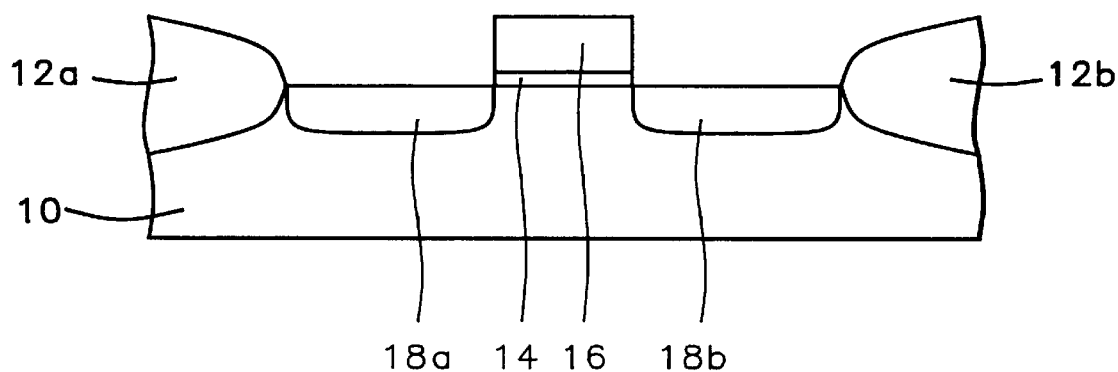
FIG. 3 to FIG. 7 show a series of schematic cross-sectional diagrams illustrating the first preferred embodiment of the method of the present invention whereby the pattern sensitivity of an ozone assisted Chemical Vapor Deposited (CVD) silicon oxide insulator layer upon a patterned layer within an integrated circuit is diminished.

Referring now to FIG. 3 to FIG. 7 there is shown a series of schematic cross-sectional diagrams illustrating the results of the first preferred embodiment of the method of the present invention in forming upon a patterned layer within an integrated circuit an ozone assisted Chemical Vapor Deposited (CVD) silicon oxide insulator layer exhibiting diminished pattern sensitivity. Shown in FIG. 3 is a schematic cross-sectional diagram of the integrated circuit at its early stages of formation.

Shown in FIG. 3 is a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention is a N- or P-silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate oxidation mask is oxidized to form isolation regions within and upon a semiconductor substrate, and methods whereby a separate insulating layer is formed upon a semiconductor substrate surface and subsequently patterned to form isolation regions upon the semiconductor substrate. For the first preferred embodiment of the present invention, the isolation regions 12a and 12b are preferably formed through a thermal oxidation method whereby portions of the semiconductor substrate 10 exposed through an oxidation mask are consumed to form within and upon the semiconductor substrate 10 isolation regions 12a and 12b of silicon oxide.

Also illustrated within FIG. 3 is a gate oxide layer 14 upon which resides a gate electrode 16. Both the gate oxide layer 14 and the gate electrode 16 reside upon the active semiconductor region of the semiconductor substrate 10. Both the gate oxide layer 14 and the gate electrode 16 are components of a Metal Oxide Semiconductor Field Effect Transistor (MOSFET).

Methods and materials through which gate oxide layers and gate electrodes may be formed upon active semiconductor regions of semiconductor substrates are known in the art. Gate oxide layers may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions of semiconductor substrates may be removed through etching methods conventional to the art.

Gate electrodes within integrated circuits are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the first preferred embodiment of the present invention, the gate oxide layer 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer 14 thickness of about 70 to about 120 angstroms. For the first preferred embodiment of the present invention, the gate electrode 16 is preferably formed by patterning and etching a blanket layer of highly doped polysilicon formed upon the blanket gate oxide layer at a thickness of about 2500 to about 3000 angstroms through a Chemical Vapor Deposition (CVD) process employing silane as the silicon source material along with suitable dopant species. Once the blanket layer of highly doped polysilicon has been patterned to yield the gate electrode 16, the gate electrode 16 may be used as an etch mask to pattern the gate oxide layer 14 from the blanket gate oxide layer.

Finally, there is shown in FIG. 3 the presence of source/drain electrodes 18a and 18b formed within the surface of the active semiconductor region of the semiconductor substrate 10 at areas not occupied by the gate electrode 16, the gate oxide layer 14 and the isolation regions 12a and 12b. Methods and materials through which source/drain electrodes may be formed within semiconductor substrates are known in the art. Such methods and materials typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species employed in forming the source/drain electrodes. Arsenic dopant species, boron dopant species and phosphorus dopant species are common in the art. For the first preferred embodiment of the present invention, the source/drain electrodes 18a and 18b are preferably formed through implanting a suitable dopant species into the active region of the semiconductor substrate 10 at about 1E14 to about 1E16 ions per square centimeter dose and about 50 to about 150 keV ion implantation energy.

Having formed a Metal Oxide Semiconductor Field Effect Transistor (MOSFET) structure comprising source/drain electrodes 18a and 18b formed into the semiconductor substrate 10, and a gate electrode 16 upon a gate oxide layer 14 adjoining the source/drain electrodes 18a and 18b, the next series of process steps in forming the diminished pattern sensitivity ozone assisted Chemical Vapor Deposited (CVD) silicon oxide insulator layer of the present invention may proceed. The results of those process steps are shown by the schematic cross-sectional diagram illustrated in FIG. 4.

Figure 4:
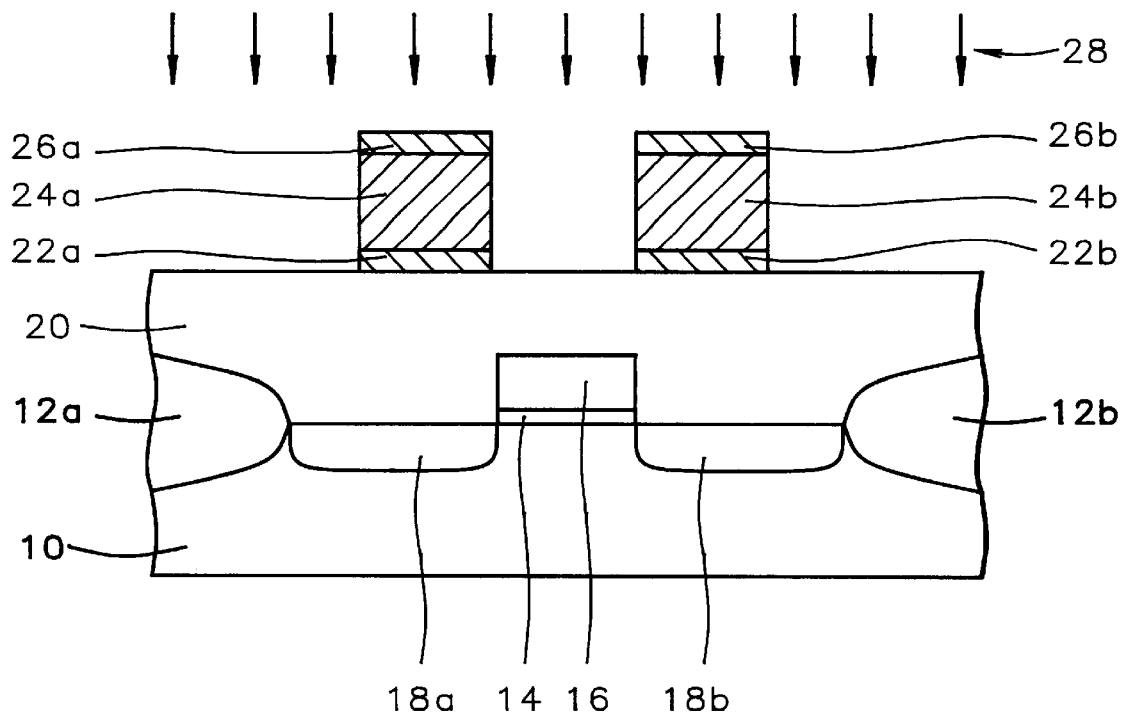

Shown in FIG. 4 is the presence of a blanket planarized Pre-Metal Dielectric (PMD) dielectric layer 20 formed upon the integrated circuit whose structure is illustrated in FIG. 3. Methods and materials through which blanket planarized Pre-Metal Dielectric (PMD) layers may be formed within integrated circuits are known in the art of integrated circuit manufacture. Blanket planarized Pre-Metal Dielectric (PMD) layers are typically, although not exclusively, formed via planarizing through methods as are conventional in the art of blanket conformal dielectric layers formed upon integrated circuit surfaces. Methods and materials through which blanket conformal dielectric layers may be formed include but are not limited to silicon oxide dielectric materials, silicon nitride dielectric materials and silicon oxynitride dielectric materials deposited upon semiconductor substrate surfaces through methods including but not limited to Chemical Vapor Deposition (CVD) methods, Plasma Enhanced Chemical Vapor Deposition (PECVD) methods and Physical Vapor Deposition (PVD) sputtering methods. Blanket conformal dielectric materials may be planarized through methods including but not limited to Reactive Ion Etch (RIE) etch-back planarizing methods and Chemical Mechanical Polish (CMP) planarizing methods. For the first preferred embodiment of the method of the present invention, the blanket planarized Pre-Metal Dielectric (PMD) layer 20 is preferably formed of silicon oxide deposited upon the semiconductor substrate 10 through a Plasma Enhanced Chemical Vapor Deposition (PECVD) method and planarized to a thickness of about 8000 to about 12000 angstroms above the source/drain electrodes 18*a* and 18*b*, as is common in the art.

Also shown in FIG. 4 is the presence of a pair of patterned first conductor stacks formed upon the blanket planarized Pre-Metal Dielectric (PMD) layer 20. The first stack within the pair of patterned first conductor stacks consists of a patterned first conductor layer 24*a*, beneath which resides a patterned first lower barrier layer 22*a* and above which resides a patterned first upper barrier layer 26*a*. The second stack within the pair of patterned first conductor stacks consists of a patterned first conductor layer 24*b*, beneath which resides a patterned first lower barrier layer 22*b* and above which resides a patterned first upper barrier layer 26*b*. Methods and materials through which patterned conductor layers and patterned barrier layers may be formed within patterned conductor stacks within integrated circuits are known in the art. Patterned conductor layers and patterned barrier layers are typically, although not exclusively, formed through patterning through methods as are conventional in the art of blanket conductor layers and blanket barrier layers. Blanket conductor layers may be formed of conductor materials including but not limited to metals, metal alloys, and highly doped polysilicon. Blanket barrier layers may be formed of barrier materials including but not limited to metal nitride barrier materials, metal silicide barrier materials and metal oxide barrier materials. Both blanket conductor layers and blanket barrier layers may be formed within integrated circuits through deposition methods including but not limited to thermally assisted deposition methods, electron beam assisted deposition methods, Chemical Vapor Deposition (CVD) methods and Physical Vapor Deposition (PVD) sputtering methods.

For the first preferred embodiment of the method of the present invention, the patterned first lower barrier layers 22*a* and 22*b* are preferably formed of titanium nitride at a thickness of from about 800 to about 1200 angstroms. In addition, the patterned first conductor layers 24*a* and 24*b* are preferably formed of an aluminum containing alloy at a thickness of from about 4000 to about 6000 angstroms. Finally, the patterned first upper barrier layers 26*a* and 26*b* are also preferably formed of titanium nitride at a thickness of from about 1000 to about 1400 angstroms. For optimal utility of the method of the present invention, the areal density of the patterned first upper barrier layers 26*a* and 26*b*, when formed of titanium nitride, is preferably greater than about 10 percent.

Finally, there is shown in FIG. 4 the presence of a first plasma 28 through which is treated the exposed surfaces of the pair of patterned first conductor stacks and the exposed surfaces of the blanket planarized Pre-Metal Dielectric (PMD) layer 20. While the mechanism by which the plasma treatment of the exposed surfaces of the pair of patterned stacks and the exposed surfaces of the blanket planarized Pre-Metal Dielectric layer 20 provides a patterned layer upon which may be formed an ozone assisted Chemical Vapor Deposited (CVD) silicon oxide insulator layer having diminished pattern sensitivity is not entirely well understood, it is nonetheless clear that an ozone assisted Chemical Vapor Deposited (CVD) silicon oxide insulator layer having diminished pattern sensitivity is formed when the exposed portions of the pair of patterned conductor stacks and the exposed portions of the blanket planarized Pre-Metal Dielectric (PMD) layer 20 have been treated with a plasma.

It is possible, without undue experimentation, for a person skilled in the art to readily determine the methods and materials through which various types of plasmas may be employed in treating various types of patterned layers such that ozone assisted Chemical Vapor Deposited (CVD) silicon oxide insulator layers may be formed upon those patterned layers, the ozone assisted Chemical Vapor Deposited (CVD) silicon oxide insulator layers exhibiting a diminished pattern sensitivity. Different materials from which may be formed patterned layers are likely to be susceptible to modification with different plasmas such that ozone assisted Chemical Vapor Deposited (CVD) silicon oxide insulator layers having diminished pattern sensitivity may be formed upon those patterned layers.

For the first preferred embodiment of the method of the present invention, it has been found experimentally that a nitrogen plasma provides the best mode of the first plasma 28 which is employed in treating the exposed portions of the patterned first conductor stacks and the exposed portions of the blanket planarized Pre-Metal Dielectric (PMD) layer 20. Methods through which nitrogen plasmas may be formed and integrated circuit surfaces exposed to those plasmas are known in the art. Nitrogen plasmas are typically formed in nitrogen plasma reactor chambers under controlled conditions of nitrogen gas flow rate, reactor chamber pressure, semiconductor substrate temperature and radio frequency power. For the first preferred embodiment of the method of the present invention, the first plasma 28 employing a nitrogen plasma is preferably formed at: (1) a nitrogen gas flow rate of from about 400 to about 600 standard cubic centimeters per minute (sccm); (2) a reactor chamber pressure of from about 1 to about 2 torr; (3) a semiconductor substrate temperature of from about 380 to about 420 degrees centigrade; and (4) a mixed radio frequency power of from about 40 to about 60 watts at a radio frequency of 13.56 MHz and about 420 to about 480 watts at a radio frequency of 350 kHz. The exposed portions of the patterned first conductor stacks and the exposed portions of the blanket planarized Pre-Metal Dielectric (PMD) layer 20 are preferably treated with the nitrogen plasma first plasma 28 for a time period of from about 160 to about 200 seconds.

Figure 5:
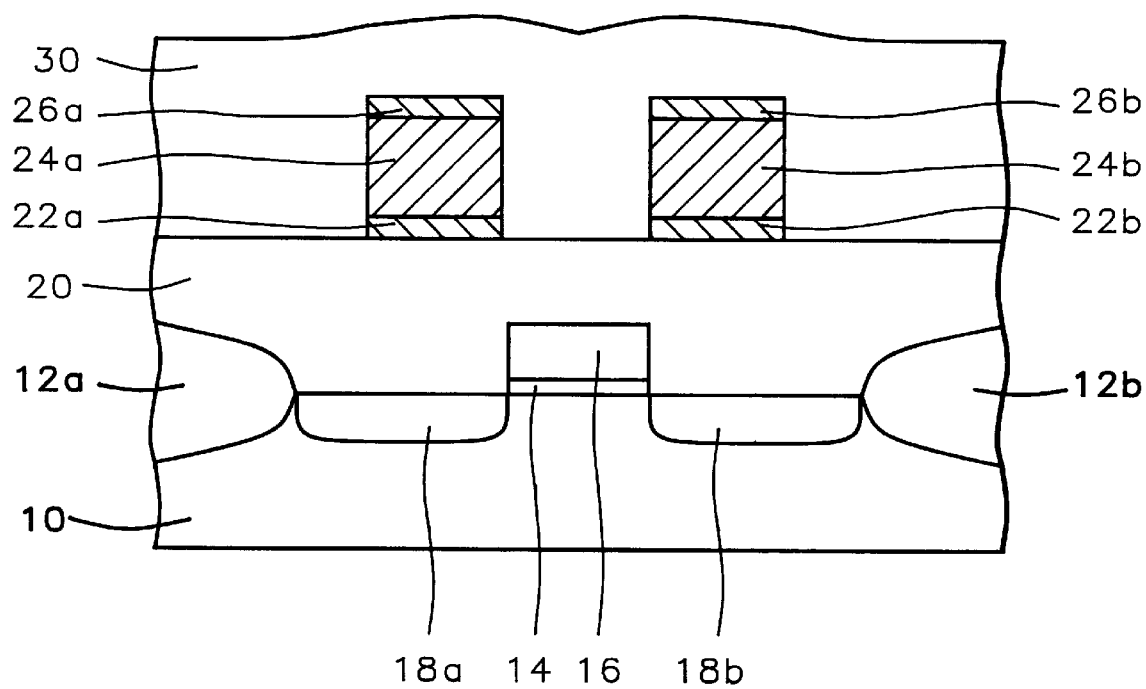

Referring now to FIG. 5, there is shown a schematic cross-sectional diagram illustrating the results of further processing of the integrated circuit whose structure is illustrated in FIG. 4. Shown in FIG. 5 is the presence of a first ozone assisted Chemical Vapor Deposited (CVD) silicon oxide insulator layer 30 formed upon the integrated circuit whose structure is illustrated in FIG. 4. Methods and materials through which ozone assisted Chemical Vapor Deposited (CVD) silicon oxide insulator layers may be formed within integrated circuits are known in the art. As is common in the art, the ozone assisted Chemical Vapor Deposited (CVD) silicon oxide insulator layer 30 is preferably formed employing Tetra Ethyl Ortho Silicate (TEOS) as a silicon source material, although other silicon source materials may also be employed. Other preferred process parameters under which is formed the ozone assisted Chemical Vapor Deposited (CVD) silicon oxide insulator layer 30 include an ozone:TEOS molar ratio of from about 12:1 to about 16:1, a reactor chamber pressure of about 350 to about 550 torr, a Tetra Ethyl Ortho Silicate (TEOS) flow rate of about 27 to about 42 standard cubic centimeters per minute (sccm), a background helium flow rate of about 1850 to about 2750 standard cubic centimeters per minute (sccm), a deposition temperature of from about 325 to about 475 degrees centigrade, and an oxygen (ozone carrier gas) flow rate of from about 4000 to about 6000 standard cubic centimeters per minute (sccm). The first ozone assisted Chemical Vapor Deposited (CVD) silicon oxide insulator layer 30 is preferably formed for a time sufficient to form upon the surfaces of the patterned first upper barrier layers 26a and 26b the first ozone assisted Chemical Vapor Deposited (CVD) silicon oxide insulator layer 30 of thickness about 4000 to about 6000 angstroms. Within the context of the preferred materials and dimensions from which are formed the pair of patterned first conductor stacks and the blanket planarized Pre-Metal Dielectric layer 20, a deposition time of from about 160 to about 240 seconds is typical for the first ozone assisted Chemical Vapor Deposited (CVD) silicon oxide insulator layer 30. A s illustrated by FIG. 5 the first ozone assisted Chemical Vapor Deposited (CVD) silicon oxide insulator layer 30 is formed without significant variations of surface topography of the first ozone assisted Chemical Vapor Deposited (CVD) silicon oxide insulator layer 30 due to a pattern sensitivity.

Figure 6:
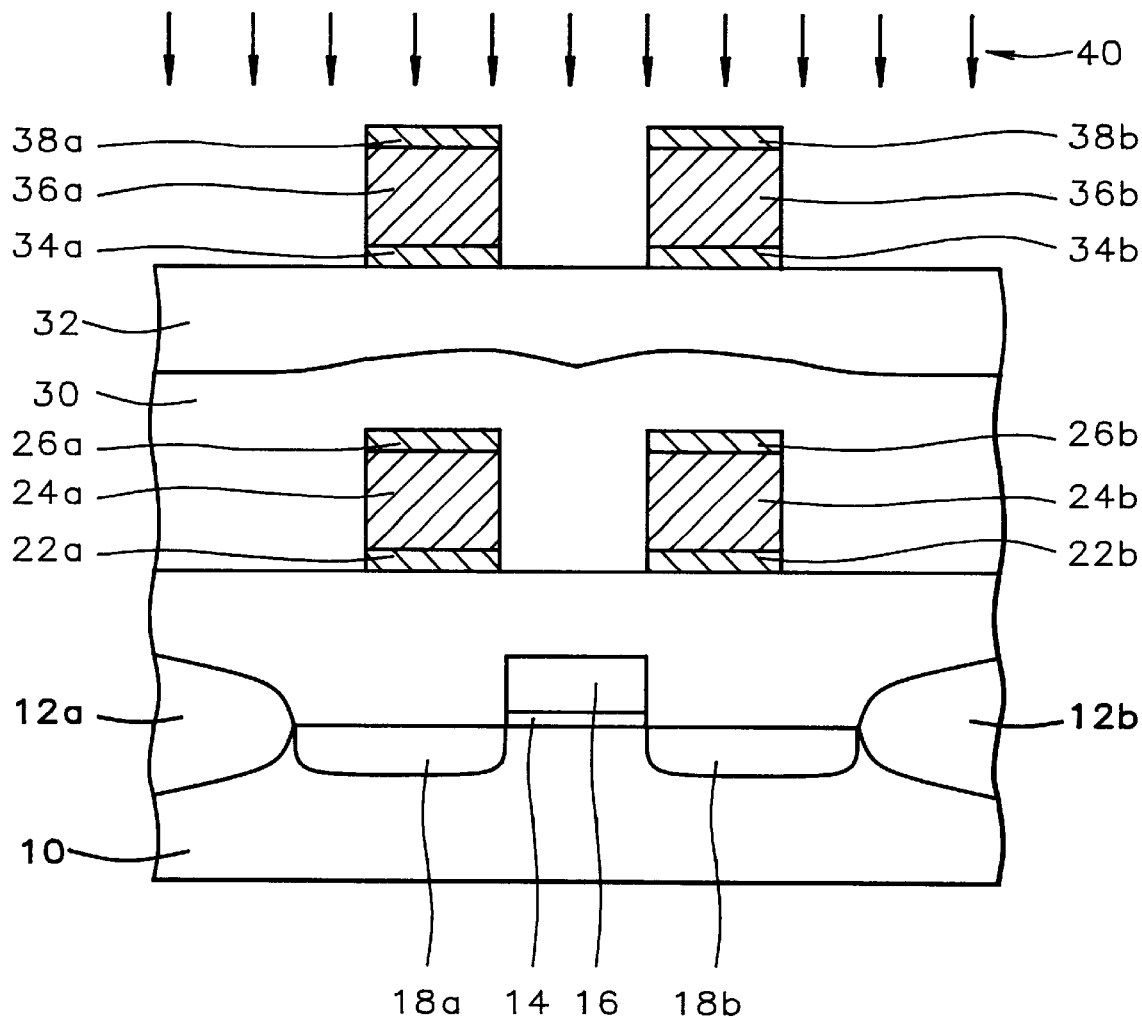

Refer ring now to FIG. 6, there is shown a schematic cross-sectional diagram illustrating the results of further processing of the integrated circuit whose structure is illustrated in FIG. 5. Shown in FIG. 6 is a blanket planarized first Inter-Conductor Dielectric (ICD) layer 32. The blanket planarized first Inter-Conductor Dielectric (ICD) layer 32 may be formed of several methods and materials as are know in the art of integrated circuit manufacture, including but not limited to silicon oxide dielectric materials, silicon nitride dielectric materials and silicon oxynitride dielectric materials deposited through Chemical Vapor Deposition (CVD) methods, Plasma Enhanced Chemical Vapor Deposition (PECVD) methods and Physical Vapor Deposition (PVD) sputtering methods. For the first preferred embodiment of the method of the present invention, the blanket planarized first Inter-Conductor Dielectric (ICD) layer 32 is preferably formed through methods and materials analogous to the methods an materials through which is formed the blanket planarized Pre-Metal Dielectric (PMD) layer 20. Such methods and materials preferably include forming a blanket conformal Inter-Conductor Dielectric (ICD) layer upon the first ozone assisted Chemical Vapor Deposited (CVD) silicon oxide insulator layer 30 through a Plasma Enhanced Chemical Vapor Deposition (PECVD) method and subsequently planarizing the blanket conformal Inter-Conductor Dielectric (ICD) layer through a Reactive Ion Etch (RIE) etch-back planarizing method or a Chemical Mechanical Polish (CMP) planarizing process, as is common in the art. Typically, the blanket planarized first Inter-Conductor Dielectric (ICD) layer 32 will have a thickness of from about 3000 to about 5000 angstroms.

Also shown in FIG. 6 is the presence of a pair of patterned second conductor stacks consisting of patterned second conductor layers 36a and 36b beneath which reside patterned second lower barrier layers 34a and 34b and above which reside patterned second upper barrier layers 38a and 38b. Each of the layers is preferably formed through methods, materials and dimensions equivalent to the methods, materials and dimensions through which are formed the corresponding patterned first lower barrier layers 22a and 22b, the patterned first conductor layers 24a and 24b and the patterned first upper barrier layers 26a and 26b.

Finally, there is also shown in FIG. 6 the presence of a second plasma 40 through which is treated the exposed surfaces of the patterned second conductor stacks and the exposed surfaces of the blanket planarized first Inter-Conductor Dielectric (ICD) layer 32. Analogously with the first plasma 28, the second plasma 40 is also preferably formed from a nitrogen plasma. In addition, the preferred nitrogen plasma second plasma 40 is also preferably formed under process conditions equivalent to the process conditions employed in forming the preferred nitrogen plasma first plasma 28. Finally, analogously with the preferred nitrogen plasma first plasma 28, the preferred nitrogen plasma second plasma 40 preferably employs a treatment time for treating the exposed surfaces of the patterned second conductor stacks and the exposed surfaces of the blanket planarized first Inter-Conductor Dielectric (ICD) layer 32 of from about 160 to about 200 seconds.

Upon treating the exposed surfaces of the patterned second conductor stacks and the exposed surfaces of the blanket planarized first Inter-Conductor Dielectric (ICD) layer 32 with the preferred nitrogen plasma second plasma 40, there is formed a patterned layer upon which may be formed an ozone assisted Chemical Vapor Deposited (CVD) silicon oxide insulator layer having a diminished pattern sensitivity. Illustrated in FIG. 7 is the results of forming such an ozone assisted Chemical Vapor Deposited (CVD) silicon oxide insulator layer.

Figure 7:
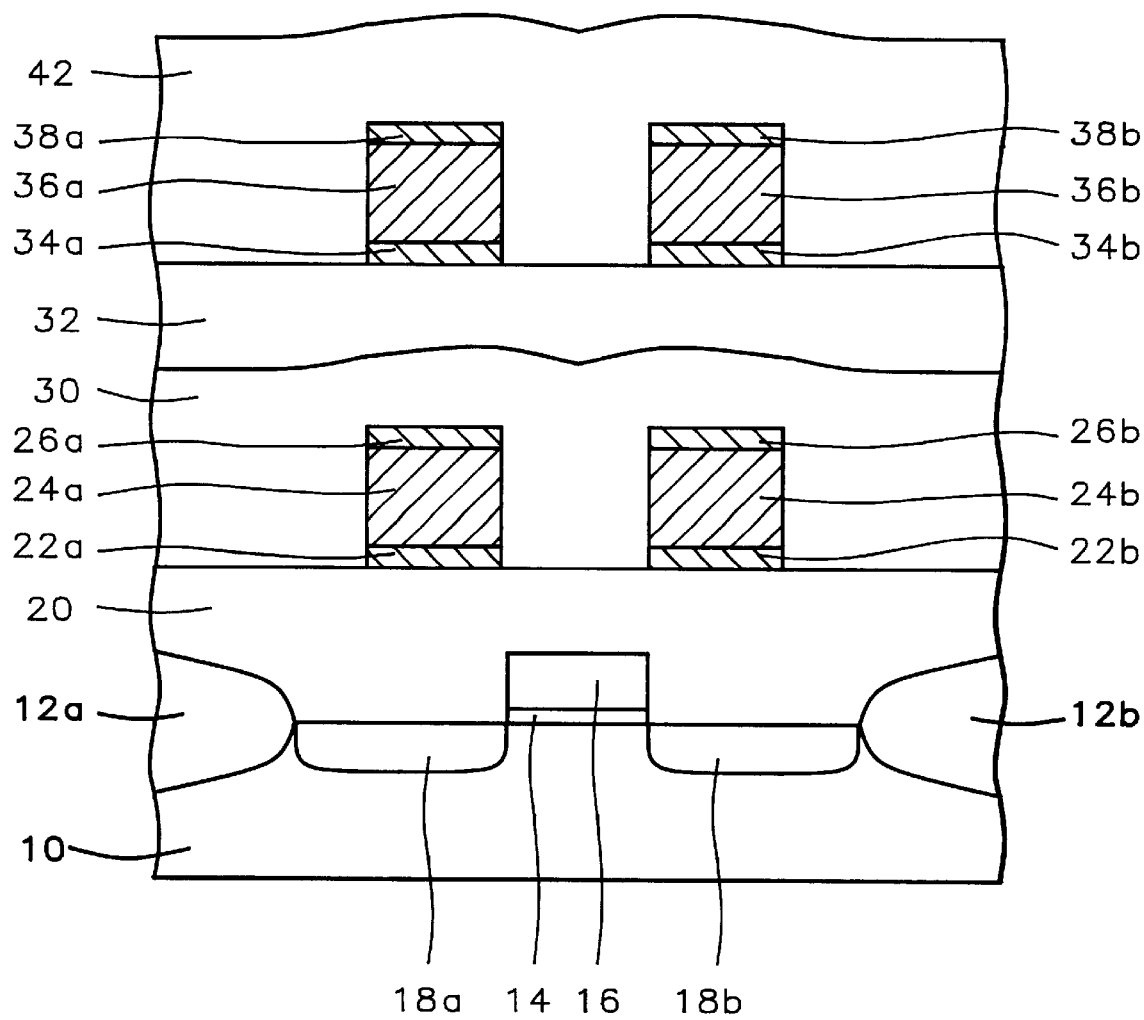

Shown in FIG. 7 is a second ozone assisted Chemical Vapor Deposited (CVD) silicon oxide insulator layer 42 formed upon the integrated circuit whose structure is illustrated in FIG. 6. The second ozone assisted Chemical Vapor Deposited (CVD) silicon oxide insulator layer 42 is preferably formed through methods, materials and dimensions equivalent to the methods, materials and dimensions through which is formed the first ozone assisted Chemical Vapor Deposited (CVD) silicon oxide insulator layer 30.

Upon forming the second ozone assisted Chemical Vapor Deposited (CVD) silicon oxide insulator layer 42, there is formed an integrated circuit through the first preferred embodiment of the method of the present invention. The integrated circuit so formed has formed therein multiple ozone assisted Chemical Vapor Deposited (CVD) silicon oxide insulator layers upon patterned layers. The ozone assisted Chemical Vapor Deposited silicon oxide insulator layers are formed with a diminished pattern sensitivity in comparison with ozone assisted Chemical Vapor Deposited (CVD) silicon oxide insulator layers otherwise known in the art. The diminished pattern sensitivity derives from first treating the patterned layers upon which are formed the ozone assisted Chemical Vapor Deposited (CVD) silicon oxide insulator layers with a plasma, preferably a nitrogen plasma.

In addition to the first preferred embodiment of the method of the present invention, there also exists a second preferred embodiment of the method of the present invention. The second preferred embodiment of the method of the present invention is equivalent to the first preferred embodiment of the method of the present invention, with the exception of a single feature of the integrated circuit which is formed through the second preferred embodiment of the method of the present invention. The single feature is illustrated by reference to FIG. 8 and FIG. 9.

Figure 8:
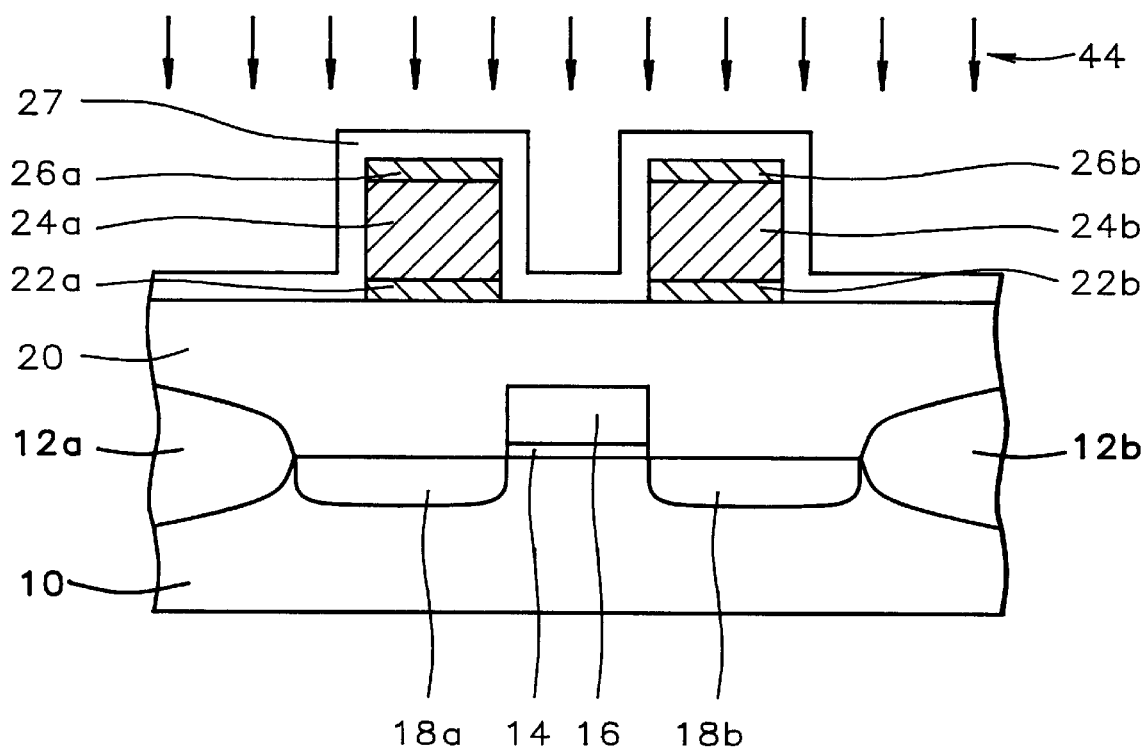
FIG. 8 and FIG. 9 show a pair of schematic cross-sectional diagrams illustrating the second preferred embodiment of the method of the present invention whereby the pattern sensitivity of an ozone assisted Chemical Vapor Deposited (CVD) silicon oxide insulator layer upon a patterned layer within an integrated circuit is diminished.

Shown in FIG. 8 is an integrated circuit otherwise equivalent to the integrated circuit illustrated in FIG. 4, with the exception of the presence of a blanket first conformal Inter-Metallic Dielectric (IMD) layer 27. The blanket first conformal Inter-Metallic Dielectric (IMD) layer 27 is preferably formed from a silicon oxide dielectric material deposited through a Plasma Enhanced Chemical vapor Deposition (PECVD) method employing Tetra Ethyl Ortho Silicate (TEOS) as the silicon source material, at a thickness of from about 500 to about 2000 angstroms. The blanket first conformal Inter-Metallic Dielectric (IMD) layer 27 is formed upon the exposed portions of the patterned first conductor stacks and the exposed portions of the blanket first planarized Pre-Metal Dielectric (PMD) layer 20. The patterned first conductor stacks are formed from the patterned first conductor layers 24a and 24b, beneath which reside the patterned first lower barrier layers 22a and 22b, respectively, and above which reside the patterned first upper barrier layers 26a and 26b, respectively. Although the blanket first conformal Inter-Metallic Dielectric (IMD) layer 27 serves as a shield which partially diminishes the pattern sensitivity of an ozone assisted Chemical Vapor Deposited (CVD) silicon oxide insulator layer formed upon the patterned first conductor stacks and the blanket planarized Pre-Metal Dielectric layer 20, it is common that a pattern sensitivity will nonetheless still be observed when forming an ozone assisted Chemical Vapor Deposited (CVD) silicon oxide insulator layer upon the blanket first conformal Inter-Metallic Dielectric (IMD) layer 27. Although not specifically illustrated in FIG. 8 the exposed portions of the patterned first conductor stacks and the exposed portions of the blanket planarized Pre-Metal Dielectric layer 20 are preferably treated with the preferred nitrogen plasma first plasma 28 prior to forming the blanket first conformal Inter-Metallic Dielectric (IMD) layer 27.

In addition to the preferred nitrogen plasma first plasma 28, the second preferred embodiment of the method of the present invention also preferably includes a third plasma 44 through which is treated the exposed surface of the blanket first conformal Inter-Metallic Dielectric (IMD) layer 27. Analogously with the first plasma 28 and the second plasma 40, the third plasma 44 is also preferably formed of a nitrogen plasma. The process parameters under which is formed the preferred nitrogen plasma third plasma 44 are preferably equivalent to the process parameters through which is formed the preferred nitrogen plasma first plasma 28 and the preferred nitrogen plasma second plasma 40. Analogously with the preferred nitrogen plasma first plasma 28 and the preferred nitrogen plasma second plasma 40, the blanket first conformal Inter-Metallic Dielectric (IMD) layer 27 is preferably treated with the preferred nitrogen plasma third plasma 44 for a time period of from about 160 to about 200 seconds.

Figure 9:
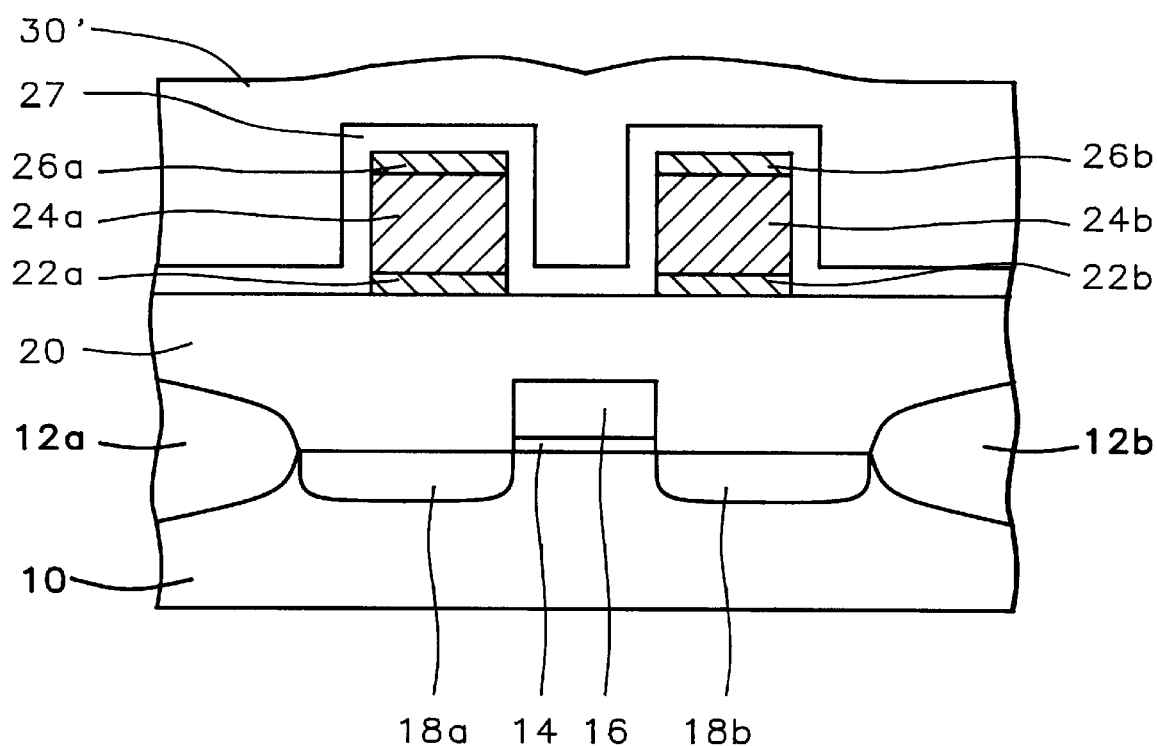

Referring now to FIG. 9, there is shown a schematic cross-sectional diagram illustrating the results of further processing of the integrated circuit whose structure is illustrated in FIG. 8. Shown in FIG. 9 is the presence of a first ozone assisted Chemical Vapor Deposited (CVD) silicon oxide insulator layer 30' which is formed upon the blanket first conformal Inter-Metallic Dielectric (IMD) layer 27. The first ozone assisted Chemical Vapor Deposited (CVD) silicon oxide insulator layer 30' is preferably formed through methods and materials equivalent to the methods and materials through which is formed the first ozone assisted Chemical Vapor Deposited (CVD) silicon oxide insulator layer 30 within the first preferred embodiment of the method of the present invention. Preferably, the first ozone assisted Chemical Vapor Deposited (CVD) silicon oxide insulator layer 30' of the second preferred embodiment of the method of the present invention is formed to a thickness of from about 4000 to about 6000 angstroms with respect to the surfaces of the blanket first conformal Inter-Metallic Dielectric (IMD) layer 27 which reside above the surfaces of the patterned first upper barrier layers 26a and 26b.

As is understood by a person skilled in the art, the integrated circuit resulting from the second preferred embodiment of the method of the present invention may, analogously with the integrated circuit resulting from the first preferred embodiment of the method of the present invention, have formed within its fabrication subsequent ozone assisted Chemical Vapor Deposited (CVD) silicon oxide insulator layers in addition to the first ozone assisted Chemical Vapor Deposited (CVD) silicon oxide insulator layer 30'. Analogously with the integrated circuit resulting from the first preferred embodiment of the method of the present invention, the integrated circuit resulting from the second preferred embodiment of the method of the present invention will also have blanket planarized Inter-Conductor Dielectric (ICD) layers formed above each ozone assisted Chemical Vapor Deposited (CVD) silicon oxide insulator layer. Different in comparison with the integrated circuit which results from the first preferred embodiment of the method of the present invention, the integrated circuit which results from the second preferred embodiment of the present invention will preferably have a blanket conformal Inter-Metallic Dielectric (IMD) beneath, and preferably have a blanket planarized Inter-Conductor Dielectric (ICD) layer above, each ozone assisted Chemical Vapor Deposited (CVD) silicon oxide insulator layer. Each of the blanket conformal Inter-Metallic Dielectric (IMD) layers preferably receives a plasma treatment, preferably a nitrogen plasma treatment. In addition, each of the patterned layers which reside beneath the blanket conformal Inter-Metallic Dielectric (IMD) layers also receives a plasma treatment, preferably a nitrogen plasma treatment.

Upon forming additional layers upon the integrated circuit whose structure is illustrated in FIG. 9, to form an integrated circuit analogous to the integrated circuit whose structure is illustrated in FIG. 7, there is formed the integrated circuit of the second preferred embodiment of the method of the present invention. The integrated circuit of the second preferred embodiment of the method of the present invention has formed therein multiple ozone assisted Chemical Vapor Deposited (CVD) silicon oxide insulator layers, each ozone assisted Chemical Vapor Deposited (CVD) silicon oxide insulator layer exhibiting a diminished pattern sensitivity from a patterned layer upon which is formed the ozone assisted Chemical Vapor Deposited (CVD) silicon oxide insulator layer.

EXAMPLES 1–8

Formed upon the surfaces of eight semiconductor substrates were integrated circuits in accord with the integrated circuit whose structure is illustrated in FIG. 8. The eight semiconductor substrates had formed thereupon a blanket planarized Pre-Metal Dielectric (PMD) layer 20 formed of a silicon oxide deposited through a Plasma Enhanced Chemical Vapor Deposition (PECVD) method employing Tetra Ethyl Ortho Silicate (TEOS) as a silicon source material. Upon the blanket planarized Pre-Metal Dielectric (PMD) layer 20 was formed a series of patterned stacks corresponding to the patterned first conductor stacks in FIG. 8, wherein: (1) the patterned lower barrier layers 22a and 22b were formed of titanium nitride deposited through a Physical Vapor Deposition (PVD) sputtering method at a thickness of about 1000 angstroms; (2) the patterned conductor layers 24a and 24b were formed of a 0.5% copper in aluminum alloy through a Physical Vapor Deposition (PVD) sputtering method at about 4000 angstroms thickness; and, (3) the patterned first upper barrier layers 26a and 26b were formed of titanium nitride deposited through a Physical Vapor Deposition (PVD) sputtering method at a thickness of about 1200 angstroms. Upon the surfaces of the semiconductor substrates were two separate regions of areal density of the patterned first conductor stacks. The more dense region had an areal density of patterned first upper barrier layers 26a and 26b of about 50 percent the surface area of the semiconductor substrate. The less dense region had an areal density of patterned first upper barrier layers 26a and 26b of about 30 percent the surface area of the semiconductor substrate.

The group of eight semiconductor substrates was then divided into two groups of four semiconductor substrates. One group of four semiconductor substrates received a first plasma 28 treatment (as illustrated in FIG. 4) employing a nitrogen plasma for about 180 seconds. The first plasma 28 was formed at: (1) a nitrogen gas flow rate of about 500 standard cubic centimeters per minute (sccm); (2) a reactor chamber pressure of about 1.5 torr; (3) a semiconductor substrate temperature of about 400 degrees centigrade; and (4) a mixed radio frequency power of about 50 watts at a radio frequency of 13.56 MHz and about 450 watts at a radio frequency of 350 kHz.

The eight semiconductor substrate wafers were then re-united and a conformal Inter-Metallic Dielectric (IMD) layer 27 was formed upon the surface of each of the eight wafers. The conformal Inter-Metallic Dielectric (IMD) layer 27 covered both the more dense patterned first conductor stack region of each wafer and the less dense patterned first conductor stack region of each wafer. The conformal Inter-Metallic Dielectric (IMD) layer 27 was formed of a silicon oxide deposited upon the semiconductor substrates through a Plasma Enhanced Chemical Vapor Deposition (PECVD) method employing Tetra Ethyl Ortho Silicate (TEOS) as the silicon source material. The conformal Inter-Metallic Dielectric (IMD) layer 27 was about 2000 angstroms in thickness. None of the semiconductor substrates received a third plasma 44 treatment as illustrated in FIG. 8.

The group of eight semiconductor substrates was then separated into four groups of two semiconductor substrates, each group of two semiconductor substrates having one semiconductor substrate which received the nitrogen plasma first plasma 28 treatment and one wafer which did not receive the nitrogen plasma first plasma 28 treatment. Upon each of the eight semiconductor substrates was then formed an ozone assisted Chemical Vapor Deposited (CVD) silicon oxide insulator layer (analogous to the ozone assisted Chemical Vapor Deposited (CVD) silicon oxide insulator layer 30' illustrated in FIG. 9) for one of four different time periods. The four different time periods were 60 seconds, 120 seconds, 180 seconds and 240 seconds. The ozone assisted Chemical Vapor Deposited (CVD) silicon oxide insulator layers were formed employing Tetra Ethyl Ortho Silicate (TEOS) as a silicon source material. The remaining parameters under which were formed the ozone assisted Chemical Vapor Deposited (CVD) silicon oxide insulator layers included an ozone:TEOS molar ratio of from about 14:1, a reactor pressure of about 450 torr, a Tetra Ethyl Ortho Silicate (TEOS) flow rate of about 35 standard cubic centimeters per minute (sccm), a background helium flow rate of about 2300 standard cubic centimeters per minute (sccm), a deposition temperature of about 400 degrees centigrade, and an oxygen (ozone carrier gas) flow rate of about 5000 standard cubic centimeters per minute (sccm).

The thicknesses of the ozone assisted Chemical Vapor Deposited (CVD) silicon oxide insulator layers upon the portions of the conformal first Inter-Metallic Dielectric (IMD) layers 27 above the patterned first upper barrier layers 26a and 26b were then measured and plotted as a function of deposition time. A linear regression analysis was performed for each of the four sets of data points which corresponded to each of the four permutations of areal density (of the patterned first upper barrier layers 26a and 26b) and the presence/absence of the nitrogen plasma first plasma 28 treatment. The linear regression analysis provided: (1) slopes which correspond to the deposition rates of the ozone assisted Chemical Vapor Deposited (CVD) silicon oxide insulator layers; and (2) intercepts which correspond to incubation times for forming the ozone assisted Chemical Vapor Deposited (CVD) silicon oxide insulator layers upon the first conformal Inter-Metallic Dielectric (IMD) layers 27.

Figure 10:
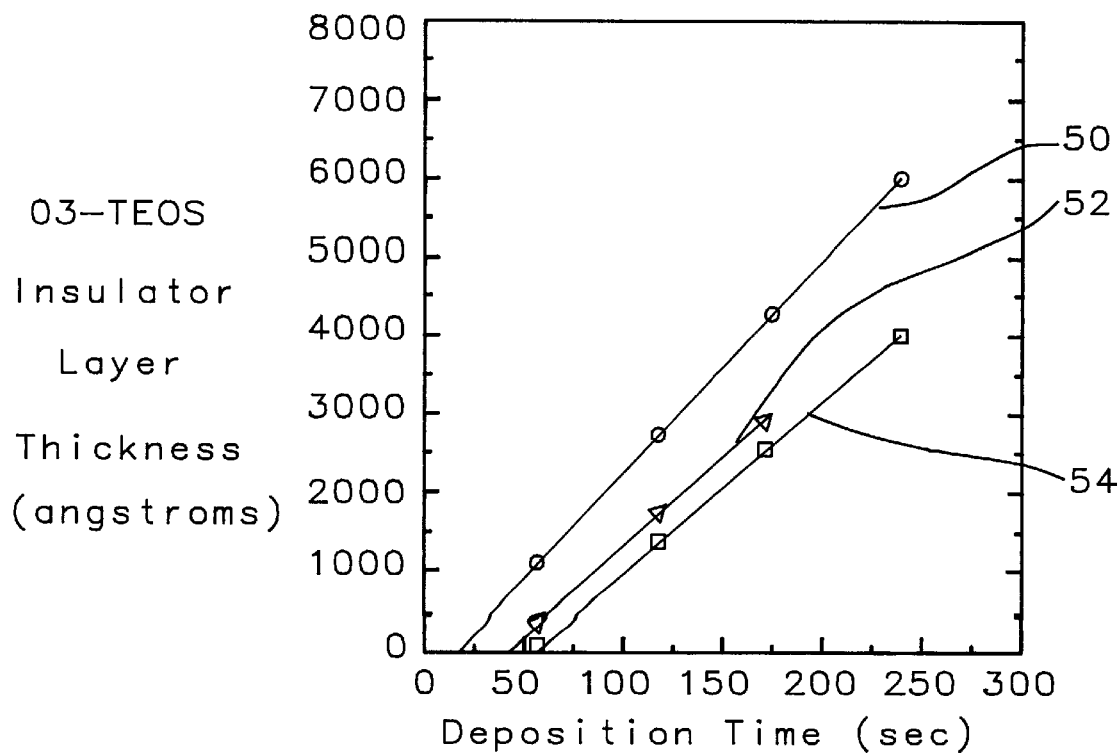
FIG. 10 shows a plot of 03-TEOS Insulator Layer Thickness versus Deposition Time for forming the ozone assisted Chemical Vapor Deposited (CVD) silicon oxide insulator layers of EXAMPLES 1–8 of the present invention.

The plotted data is shown in FIG. 10. Within FIG. 10, reference numeral 50 corresponds to the linear regression lines derived from the thicknesses of the ozone assisted Chemical Vapor Deposited (CVD) silicon oxide insulator layers formed upon the less dense patterned first conductor stack region with either the presence or absence of a nitrogen plasma first plasma 28 treatment. Reference numeral 52 corresponds to the linear regression line derived from the thicknesses of the ozone assisted Chemical Vapor Deposited (CVD) silicon oxide insulator layers upon the more dense patterned first conductor stack region with the presence of a nitrogen plasma first plasma 28 treatment. Reference numeral 54 corresponds to the linear regression line derived from the thicknesses of the ozone assisted Chemical Vapor Deposited (CVD) silicon oxide insulator layers upon the more dense patterned first conductor stack region with the absence of a nitrogen plasma first plasma 28 treatment. The values of the deposition rates and incubation times determined from the linear regressions are summarized in TABLE I.

TABLE I

| TiN Pattern | N2 Plasma | Dep. Rate (A/min) | Incub. Time (sec) |
| --- | --- | --- | --- |
| less dense | no | 1634 | 21 |
| less dense | yes | 1624 | 20 |
| more dense | no | 1294 | 58 |
| more dense | yes | 1321 | 43 |

From review of the data of TABLE I it is seen that the areal density of titanium nitride patterned upper barrier layers 26a and 26b beneath a first conformal Inter-Metallic Dielectric (IMD) layer 27 has a significant effect upon both the deposition rate and incubation time of an ozone assisted Chemical Vapor Deposited (CVD) silicon oxide insulator layer formed upon the first conformal Inter-Metallic Dielectric layer 27. Under conditions of lower areal density of the patterned first upper barrier layers 26a and 26b, a nitrogen plasma treatment affects neither the deposition rate nor the incubation time of an ozone assisted Chemical Vapor Deposited (CVD) silicon oxide insulator layer formed upon a first conformal Inter-Metallic Dielectric (IMD) layer 27 which is formed upon the patterned first upper barrier layers 26a and 26b. Under conditions of higher areal density of the patterned first upper barrier layers 26a and 26b, a nitrogen plasma treatment minimally affects the deposition rate and substantially affects the incubation time of an ozone assisted Chemical Vapor Deposited (CVD) silicon oxide insulator layer formed upon a first conformal Inter-Metallic Dielectric (IMD) layer 27 which is formed upon the patterned first upper barrier layers 26a and 26b.

EXAMPLES 9–11

Upon the surfaces of three semiconductor substrates were formed integrated circuit structures equivalent to the integrated circuit structures illustrated in FIG. 8 and FIG. 9. The methods, materials and thicknesses to which these structures were formed were equivalent to the methods, materials and thicknesses disclosed in EXAMPLES 1–8, with the exception that the exposure time of the exposed portions of the patterned first conductor stacks and the exposed portions of the blanket planarized Pre-Metal Dielectric (PMD) layer 20 to the nitrogen plasma first plasma 28 (as illustrated in FIG. 4) treatment were varied. One semiconductor substrate received no nitrogen plasma first plasma 28 treatment. The second semiconductor substrate received a nitrogen plasma first plasma 28 treatment for 150 seconds. The third semiconductor substrate received a nitrogen plasma first plasma 28 treatment for 300 seconds.

Analogously with EXAMPLES 1–8 none of the three semiconductor substrates received a third plasma 44 treatment (as illustrated in FIG. 8). Also analogously with EXAMPLES 1–8, a blanket first conformal Inter-Metallic Dielectric (IMD) layer 27 was formed upon each of the three semiconductor substrates at a thickness of about 2000 angstroms from a silicon oxide material deposited through a Plasma Enhanced Chemical Vapor Deposited (PECVD) method employing Tetra Ethyl Ortho Silicate (TEOS) as a silicon source material. Upon the three semiconductor substrates were then formed ozone assisted Chemical Vapor Deposited (CVD) silicon oxide insulator layers, such as ozone assisted Chemical Vapor Deposited (CVD) silicon oxide insulator layer 30' illustrated in FIG. 9. The nominal thickness of the ozone assisted Chemical Vapor Deposited (CVD) silicon oxide insulator layers was about 5000 angstroms with respect to the portions of the blanket first conformal Inter-Metallic Dielectric (IMD) layers 27 which resided upon the patterned upper barrier layers 26a and 26b. The thicknesses of the ozone assisted Chemical Vapor Deposited (CVD) silicon oxide insulator layers were then measured over the surfaces of the first conformal Inter-Metallic Dielectric (IMD) layers 27 which resided over the more areal dense region of patterned first upper barrier layers 26a and 26b and the less areal dense region of patterned first upper barrier layers 26a and 26b. The pattern sensitivity was then calculated as: [O3/TEOS less dense thickness–O3/TEOS more dense thickness]/[2×O3/TEOS average thickness]. The calculated pattern sensitivities as a function of nitrogen plasma first plasma 28 treatment time are reported in TABLE II.

TABLE II

| N2 Plasma Treatment | Pattern Sensitivity |
| --- | --- |
| 0 min | 10.0% |
| 2.5 min | 4.4% |
| 5 min | 4.4% |

From review of the data of TABLE II it is seen that nitrogen plasma first plasma 28 treatments, when provided in accord with the preferred embodiments of the present invention and for time periods in excess of 300 seconds, provide optimally minimum pattern sensitivities for ozone assisted Chemical Vapor Deposited (CVD) silicon oxide insulator layers which are formed upon first conformal Inter-Metallic Dielectric (IMD) layers beneath which reside patterned first upper barrier layers 26a and 26b which have received those nitrogen plasma first plasma 28 treatments.

As is understood by a person skilled in the art, the preferred embodiments and EXAMPLES of the method of the present invention are illustrative of the method of the present invention rather than limiting of the method of the present invention. Modifications may be made to methods, materials, structures and dimensions through which are practiced the preferred embodiments and EXAMPLES of the method of the present invention while still forming embodiments and examples which are within the spirit and scope of the method of the present invention.

What is claimed is:

1. A method for forming an ozone assisted Chemical Vapor Deposited (CVD) silicon oxide insulator layer having diminished pattern sensitivity comprising:

providing a semiconductor substrate;

forming upon the semiconductor substrate a patterned layer, the patterned layer providing a pattern sensitivity to an ozone assisted Chemical Vapor Deposited (CVD) silicon oxide insulator layer formed upon the patterned layer, the patterned layer being susceptible to modification with a plasma which reduces the pattern sensitivity of the ozone assisted Chemical Vapor Deposited (CVD) silicon oxide insulator layer formed upon the patterned layer;

treating the patterned layer with the plasma; and, forming upon the patterned layer the ozone assisted Chemical Vapor Deposited (CVD) silicon oxide insulator layer.

2. The method of claim 1 wherein the patterned layer is a patterned conductor layer.

3. The method of claim 2 wherein the patterned conductor layer has formed upon its surface a patterned titanium nitride layer.

4. The method of claim 3 wherein the thickness of the patterned titanium nitride layer is from about 1000 to about 1400 angstroms.

5. The method of claim 3 wherein the areal density of the patterned titanium nitride layer upon the semiconductor substrate is greater than about 10 percent.

6. The method of claim 1 wherein the ozone assisted Chemical Vapor Deposited (CVD) silicon oxide insulator layer employs Tetra Ethyl Ortho Silicate (TEOS) as a silicon source material.

7. The method of claim 6 wherein the ozone assisted Chemical Vapor Deposited (CVD) silicon oxide insulator layer is formed at an ozone:TEOS molar ratio of from about 12:1 to about 16:1.

8. The method of claim 1 wherein the plasma is a nitrogen plasma.

9. The method of claim 8 wherein the nitrogen plasma is provided at a nitrogen flow rate of about 400 to about 600 standard cubic centimeters per minute (sccm), a reactor chamber pressure of from about 1 to about 2 torr and a mixed radio frequency power of from about 40 to about 60 watts at a radio frequency of 13.56 MHz and about 420 to about 480 watts at a radio frequency of 350 kHz.

10. The method of claim 9 wherein the nitrogen plasma is provided for a time period of from about 160 to about 200 seconds.

11. A method for forming an ozone assisted Chemical Vapor Deposited (CVD) silicon oxide insulator layer having diminished pattern sensitivity comprising:

providing a semiconductor substrate;

forming upon the semiconductor substrate a patterned layer, the patterned layer providing a pattern sensitivity to an ozone assisted Chemical Vapor Deposited (CVD) silicon oxide insulator layer formed upon the patterned layer, the patterned layer being susceptible to modification with a plasma which reduces the pattern sensitivity of the ozone assisted Chemical Vapor Deposited (CVD) silicon oxide insulator layer formed upon the patterned layer;

treating the patterned layer with the plasma;

forming a conformal insulator layer upon the patterned layer; and, forming the ozone assisted Chemical Vapor Deposited (CVD) silicon oxide insulator layer upon the conformal insulator layer.

12. The method of claim 11 wherein the patterned layer is a patterned conductor layer having upon its surface a patterned titanium nitride layer, the patterned titanium nitride layer having a thickness of from about 1000 to about 1400 angstroms.

13. The method of claim 12 wherein the areal density of the patterned titanium nitride layer upon the semiconductor substrate is greater than about 10 percent.

14. The method of claim 11 wherein the ozone assisted Chemical Vapor Deposited (CVD) silicon oxide insulator layer employs Tetra Ethyl Ortho Silicate (TEOS) as a silicon source material.

15. The method of claim 14 wherein the ozone assisted Chemical Vapor Deposited (CVD) silicon oxide insulator layer is formed at an ozone:TEOS molar ratio is from about 12:1 to about 16:1.

16. The method of claim 11 wherein the plasma is a nitrogen plasma provided at a nitrogen flow rate of about 400 to about 600 standard cubic centimeters per minute (sccm), a reactor chamber pressure of from about 1 to about 2 torr and a mixed radio frequency power of from about 40 to about 60 watts at a radio frequency of 13.56 MHz and about 420 to about 480 watts at a radio frequency of 350 kHz.

17. The method of claim 16 wherein the nitrogen plasma is provided for a time period of from about 160 to about 200 seconds.

18. The method of claim 11 wherein the conformal insulator layer is a conformal silicon oxide insulator layer formed upon the patterned layer at a thickness of from about 500 to about 2000 angstroms.

19. The method of claim 11 further comprising treating the conformal insulator with a second plasma prior to forming upon the conformal insulator layer the ozone assisted Chemical Vapor Deposited (CVD) silicon oxide insulator layer, the second plasma being a nitrogen plasma.

20. A method for forming within an integrated circuit an ozone assisted Chemical Vapor Deposited (CVD) silicon oxide insulator layer having diminished pattern sensitivity comprising:

providing a semiconductor substrate;

forming upon the semiconductor substrate a minimum of one transistor;

forming upon the semiconductor substrate a patterned layer, the patterned layer providing a pattern sensitivity to an ozone assisted Chemical Vapor Deposited (CVD) silicon oxide insulator layer formed upon the patterned layer, the patterned layer being susceptible to modification with a plasma which reduces the pattern sensitivity of the ozone assisted Chemical Vapor Deposited (CVD) silicon oxide insulator layer formed upon the patterned layer;

treating the patterned layer with the plasma; and, forming upon the patterned layer the ozone assisted Chemical Vapor Deposited (CVD) silicon oxide insulator layer.

21. The method of claim 20 wherein the patterned layer is a patterned conductor layer having a patterned titanium nitride layer upon its surface, the patterned titanium nitride layer having a thickness of from about 1000 to about 1400 angstroms.

22. The method of claim 21 wherein the areal density of the patterned titanium nitride layer upon the semiconductor substrate is greater than about 10 percent.

23. The method of claim 20 wherein the ozone assisted Chemical Vapor Deposited (CVD) silicon oxide insulator layer employs Tetra Ethyl Ortho Silicate (TEOS) as a silicon source material at an ozone:TEOS molar ratio is from about 12:1 to about 16:1.

24. The method of claim 20 wherein the plasma is a nitrogen plasma.

25. The method of claim 24 wherein the nitrogen plasma is provided at a nitrogen flow rate of about 400 to about 600 standard cubic centimeters per minute (sccm), a reactor chamber pressure of from about 1 to about 2 torr and a mixed radio frequency power of from about 40 to about 60 watts at a radio frequency of 13.56 MHz and about 420 to about 480 watts at a radio frequency of 350 kHz.

26. The method of claim 25 wherein the nitrogen plasma treatment is undertaken for a time period of from about 160 to about 200 seconds.

* * * * *